United States Patent [19]

Gegenwart et al.

[11] Patent Number: 5,144,196

[45] Date of Patent: Sep. 1, 1992

[54] PARTICLE SOURCE, ESPECIALLY FOR REACTIVE IONIC ETCHING AND PLASMA-SUPPORTED CVD PROCESSES

[75] Inventors: Rainer Gegenwart, Roedermark; Jochen Ritter, Laubach, both of Fed. Rep. of Germany

[73] Assignee: Leybold Aktiengesellschaft, Hanau, Fed. Rep. of Germany

[21] Appl. No.: 768,994

[22] Filed: Sep. 30, 1991

[30] Foreign Application Priority Data

Jun. 12, 1991 [DE] Fed. Rep. of Germany ....... 4119362

[51] Int. Cl.⁵ .............................................. H05H 1/46
[52] U.S. Cl. .......................... 315/111.41; 315/111.21; 313/231.31; 204/298.38
[58] Field of Search ................ 315/111.21, 111.41, 315/111.81, 111.71; 313/231.31; 204/298.38, 298.37, 298.16

[56] References Cited

U.S. PATENT DOCUMENTS

| | | | |
|---|---|---|---|
| 4,512,868 | 4/1985 | Fujimura et al. | 204/298.28 |
| 4,609,428 | 9/1986 | Fujimura | 204/298.37 X |
| 4,610,770 | 9/1986 | Saito et al. | 204/298.16 X |
| 4,718,976 | 1/1988 | Fujimura | 204/298.38 X |
| 4,739,169 | 4/1988 | Kurosawa et al. | 315/111.81 X |
| 4,776,918 | 10/1988 | Otsubo et al. | 204/298.38 X |
| 5,022,977 | 6/1991 | Matsuoka et al. | 315/111.41 X |

FOREIGN PATENT DOCUMENTS 3803355  5/1990  Fed. Rep. of Germany.
40370917 11/1991  Fed. Rep. of Germany.

Primary Examiner—Eugene R. LaRoche
Assistant Examiner—Do Hyun Yoo
Attorney, Agent, or Firm—Felfe & Lynch

[57] ABSTRACT

Particle source, especially for reactive ion etching and plasma-enhanced CVD processes in pass-through apparatus for the treatment of large-area substrates (4) having a container completely enveloping a first plasma (19), a magnetic field generator (8, 9, 10) which fulfills the electron-cyclotron resonance, a waveguide (15) connected to the container for the delivery of electromagnetic waves, preferably microwaves (17), for the production of the plasma (19), a coupling window (16) as well as a gas feeding system for supplying the plasma process with reactive, and, for example, inert gas, the first plasma (19) being enveloped by a plasma chamber (7), the interior spaces of the plasma chamber (7) and of the adjacent vacuum chamber (2) are connected to one another, an additional guard window (12) is situated in the plasma chamber (7) directly in front of the coupling window and has an approximately constant gap (13) between it and the chamber walls (7c, 7d), a separate feeding is performed of for example inert gas (11) into the space between coupling window (16) and guard window (12) and of reactive gas (6) between guard window (12) and substrate (4), and an intermediate plasma is ignitable between coupling window (16) and guard window (12).

5 Claims, 3 Drawing Sheets

5,144,196

PARTICLE SOURCE, ESPECIALLY FOR REACTIVE IONIC ETCHING AND PLASMA-SUPPORTED CVD PROCESSES

BACKGROUND OF THE INVENTION

The invention relates to a particle source in accordance with the introductory part of claim 1.

The PE-CVD technique is a plasma-chemical method for the coating of surfaces.

In contrast to conventional vacuum coating processes, sputtering and vapor-depositing, in the PE-CVD technique (plasma-enhanced chemical vapor deposition), the coating material is fed in gas form.

The gas molecules admitted into the vacuum chamber are ionized, dissociated and excited in a glow discharge by electron collision. The excited molecules and ions react at the substrate surfaces and deposit themselves thereon, forming a tight layer on the substrates.

In the field of CVD and etching technology, apparatus are generally known which operate with RF plasma excitation in parallel-plate reactors, in which, however, the energy of the particles striking the substrates cannot be adjusted independently of the plasma excitation.

In particular an apparatus is known (DE P 40 37 091.7) which uses for the production of plasmas microwaves which in combination with magnetic fields produce an electron-cyclotron resonance and thus produce an elevated ionization of atoms and molecules.

Also known is a particle source for a reactive ion beam etching or plasma depositing apparatus (DE 38 03 355) which has a container which envelops a gas or gas mixture provided for the plasma excitation, has an input for electromagnetic waves, preferably microwaves ($\mu$W), supplying microwave energy to the gas or gas mixture, contains a first magnetic field generator that is oriented such that a magnetic field reaches into the interior of the container, and contains a second magnetic field generator which is disposed centrally to the first magnetic field generator.

The important disadvantages of RF plasma excitation in parallel-plate reactors are the strong coupling of plasma excitation and depositing or etching action (bias dependent on RF power) on the substrate, as well as the limitation of the substrate size by the uniformity of the RF excitation and of the gas dynamics.

For the above-named $\mu$W plasma processes it is disadvantageous that they cannot be used in pass-through apparatus, and in static processes they are limited to round substrates of up to 200 mm diameter.

SUMMARY OF THE INVENTION

The present invention is therefore addressed to the problem of eliminating the above-described disadvantages and furthermore to reduce the apparatus and operating costs, i.e., to achieve a simple design of the source and low contamination of the inside walls of the chamber, and thus to extend the time intervals between the maintenance periods.

This problem is solved in accordance with the features of claim 1.

The particle source in accordance with the invention is advantageously flange-mounted as a compact unit on a vacuum chamber and can easily and quickly be removed therefrom. The useful life of the plasma source is prolonged.

By igniting a plasma between the coupling window and the guard window, it becomes possible to create an area with a variable refractive index for electromagnetic waves and thus to achieve an advantageous equalization of the electromagnetic wave passing through the guard window. A further improvement as well as a variation of the distribution of the microwaves in the plasma chamber can be brought about by T-shaped coupling members interchangeably disposed along the $\mu$W waveguide.

Contamination is likewise considerably reduced in the entire apparatus, namely by the enclosure of the excited particles within the plasma chamber (plasma confinement) and by a grid system in the area between the plasma and the substrate that is to be coated. Thus instabilities during the process and the flaking off of coatings developed without control can be prevented. The coupling window which separates the atmospheric pressure face in the microwave guide from the vacuum in the plasma chamber is considered as an especially exposed component as regards contamination; by means of a heated guard window disposed in front of the coupling window the coupling window then advantageously has a longer useful life and a lower production of particles.

Additional features and possibilities for embodiment are further described and characterized in the subordinate claims.

BRIEF DESCRIPTION OF THE DRAWINGS

The invention admits of different forms of embodiment, some of them represented in the appended drawings, wherein.

DESCRIPTION OF THE PREFERRED IMBODIMENTS

Figure 1:
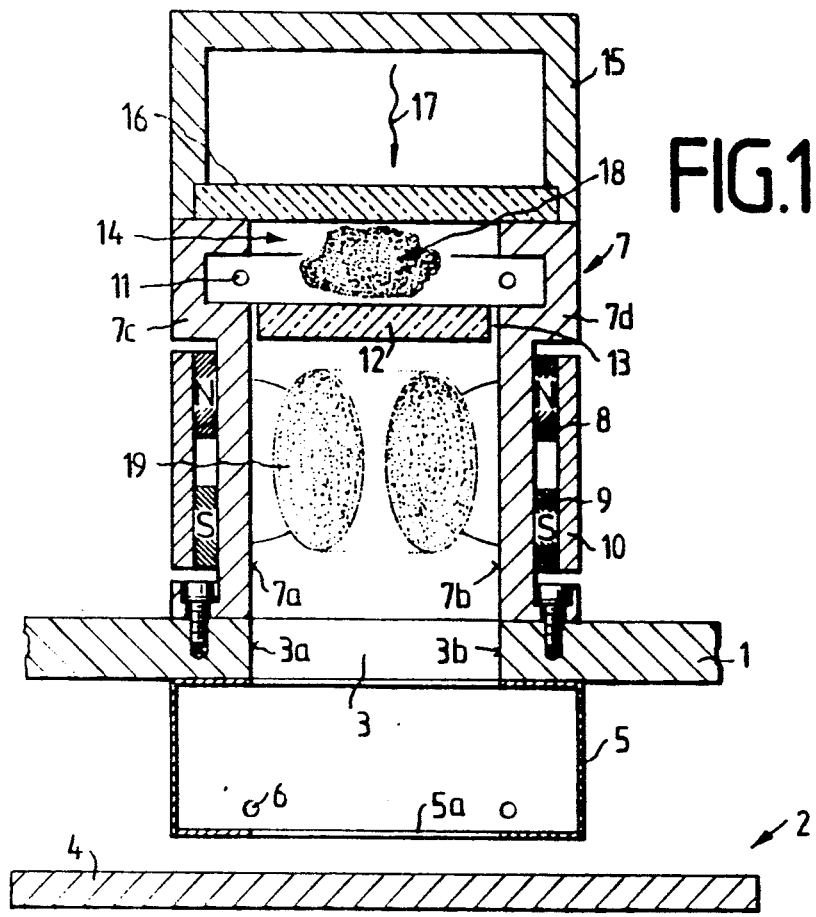
FIG. 1 is a diagrammatic representation of a particle source for plasma CVD and etching processes, consisting essentially of a plasma chamber, a magnet set and conduits.

As FIG. 1 shows, there is a rectangular opening 3 in the chamber wall 1 of a vacuum chamber 2. In the chamber 2 a substrate 4 that is to be coated can be moved underneath and past the opening 3 while between the chamber wall 1 and substrate 4 there is provided a (plasma confinement) grid 5 with a reactive gas line 6. Outside of the vacuum chamber 2 is a plasma chamber 7 which adjoins the chamber wall 1 in a vacuum-tight manner, while the inner wall surfaces 7a, 7b, of the plasma chamber 7 adjoin the opening directly in prolongation of the boundary surfaces 3a, 3b, of the opening 3. The lateral walls 7c, 7d, of plasma chamber 7 are shaped in a mirror-image symmetry. In the one recess closest to the chamber wall 1, the magnets 8, 9, are disposed on the outside of the walls 7c and 7d and are joined together by a yoke 10. A second recess is situated on the side of plasma chamber 7 that faces away from the chamber wall 1. In this recess a gas line 11 is provided in the interior of chamber 7, the space around this gas line 11 being divided by a guard window 12 of quartz glass from the rest of the interior of the plasma chamber 7. This window 12 is not in direct contact with the chamber walls 7c and 7d, but is separated and thus virtually thermally isolated from the latter by a gap 13.

Above the gas line 11 the plasma chamber 7 has an opening 14 which is identical in shape and size to opening 3 in chamber wall 1 and is disposed opposite the latter. This opening 14 is adjoined by a rectangular waveguide 15, a coupling window 16 of fused vitreous silica being provided between it and the plasma chamber, so that the area of atmospheric pressure within the waveguide 15 is separated from the rest of the areas within the plasma chamber 7 in which a vacuum of about $1 \times 10^{-3}$ mbar prevails.

Microwaves 17 from a microwave source not represented are fed into the waveguide 15 and coupled through the window 16 into an intermediate plasma space between the two windows 16 and 12. When inert oxygen or nitrogen gas is fed through the gas line 11 an intermediate plasma 18 forms between the two windows 16 and 12. When the microwaves 17 pass through this plasma 18 and the guard window 12, the power distribution of the microwaves 17 is equalized on account of the variable refractive index in the intermediate plasma space. The species (ions, electrons) excited in the intermediate plasma 18 flow out of this intermediate plasma space through a gap 13 into the plasma space between the guard window 12 and the substrate 4 and thus transfer the excitation to the reactive gas issuing from the gas line 6. A second plasma 19 develops which, by the arrangement of the magnetic field lines between the magnets 8 and 9, is formed into two areas of maximum plasma concentration.

The grid 5 leads to an additional confinement of the plasma 19, so that the excited particles pass out of the plasma space only through an opening 5a of defined magnitude and thus any possible contamination of the interior of the chamber 2 is reduced to a minimum.

Figure 2:
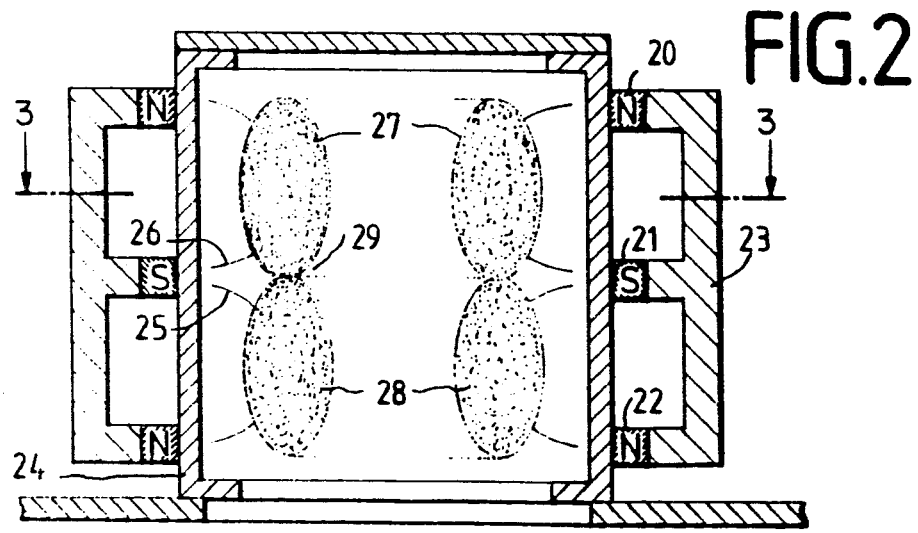
FIG. 2 is a diagrammatic representation of a double magnetic field ring as a detail of a system similar to FIG. 1.

A detail of a particle source, similar to the above-described, is shown in FIG. 2. It differs, however, from the foregoing by having 3 magnets 20, 21, 22, which are joined together by a yoke 23, so that the magnetic lines of force 25 and 26 are formed doubly in the interior of the plasma chamber 24. In this magnetic field a plasma 27, 28, is ignited, which has its maximum intensity in each case in an oval area. Due to the double magnetic field ring 25, 26, a magnetic bottle 29 forms, in which the electronic density is increased.

Figure 3:
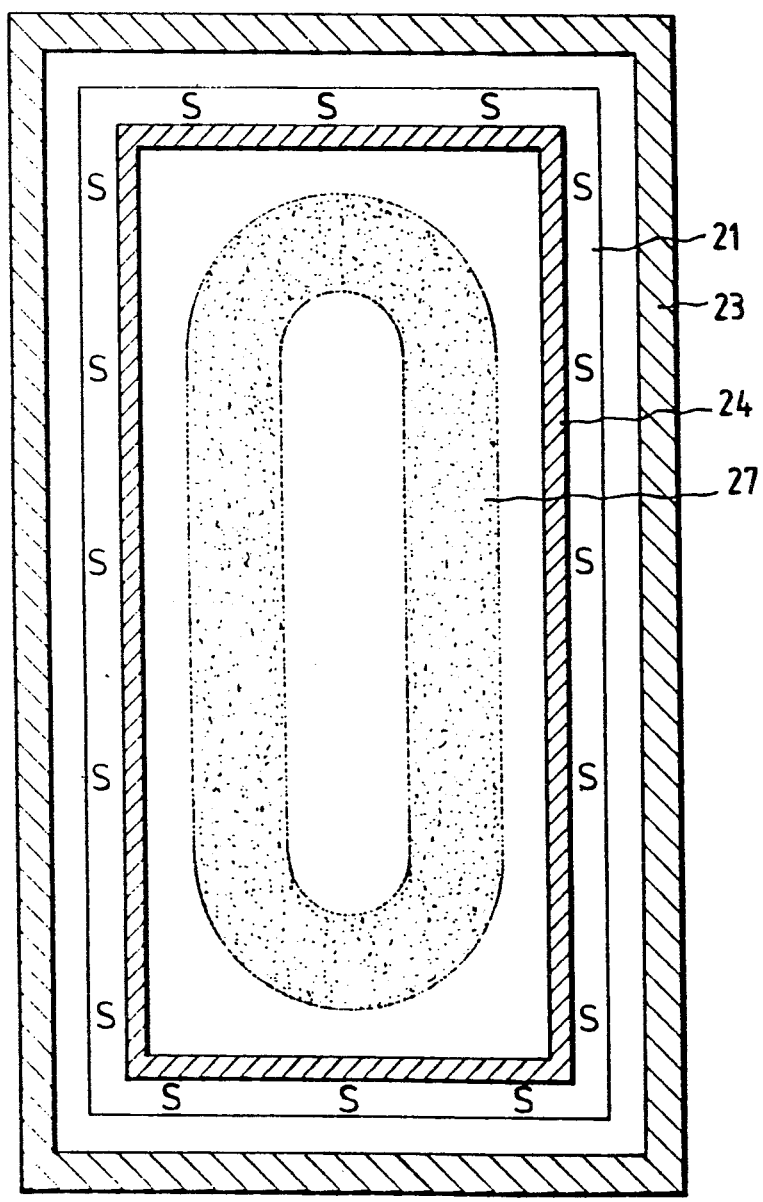
FIG. 3 represents the diagrammatic shape of a plasma loop in the shape of a racetrack along the section line A—A in FIG. 2.

In the case of a rectangular shape of the plasma chamber 24 (FIG. 3), a plasma loop 27 is formed which is at an approximately constant distance from the wall of the plasma chamber 24.

Figure 4A:
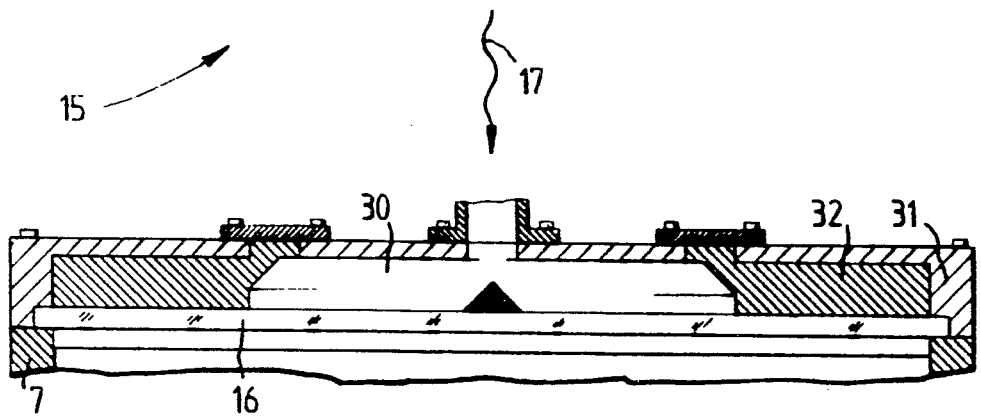
FIG. 4a is a section of a coupling point between a waveguide and the plasma chamber, with a T-shaped coupling member.

The coupling of the microwaves 17 (FIG. 4a) from a μW waveguide 15 into a plasma chamber 7 is accomplished for example by a T-shaped coupling member 30. This is inserted, adjusted and fastened into a holding frame 31. The remaining free space between the coupling member 30 on the one hand and holding frame 31 as well as coupling window 16 on the other, is filled with a filler piece 32.

Figure 4B:
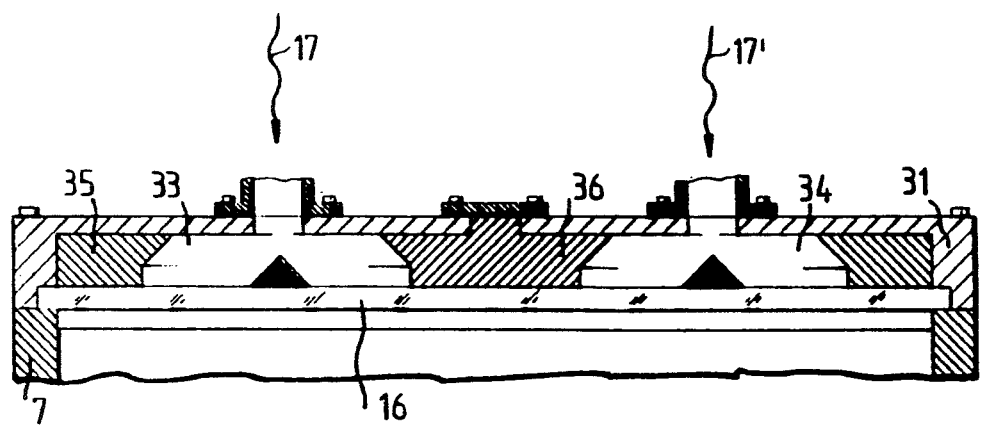
FIG. 4b is a detail of a coupling point between a waveguide and the plasma chamber (as in FIG. 4a) with two T-shaped coupling members.

By replacing the coupling member 30 and the filler 32 (FIG. 4b) with two smaller T-shaped coupling members 33, 34, as well as two filler pieces 35, 36, the distribution of the microwaves 17, 17', in the plasma chamber 7, and thus also the plasma distribution, can be varied with relatively little trouble.

| List of Reference Numbers | |
|---|---|
| 1 | chamber wall |
| 2 | vacuum chamber |
| 3 | opening |
| 3a, 3b | boundary surface |
| 4 | substrate |
| 5 | (plasma confinement) grid |
| 5a | opening |
| 6 | reactive gas feed |
| 7 | plasma chamber |
| 7a, 7b | wall surface |
| 7c, 7d | lateral wall, chamber wall |
| 8 | magnet |
| 9 | magnet |
| 10 | yoke |
| 11 | gas feed |
| 12 | guard window |
| 13 | gap |
| 14 | opening |
| 15 | waveguide |
| 16 | coupling window |
| 17, 17' | microwaves |
| 18 | intermediate plasma |
| 19 | plasma |
| 20 | magnet |
| 21 | magnet |
| 22 | magnet |
| 23 | yoke |
| 24 | plasma chamber |
| 25 | magnetic field lines |
| 26 | magnetic field lines |
| 27 | plasma |
| 28 | plasma |
| 29 | magnetic bottle |
| 30 | coupling member |
| 31 | holding frame |
| 32 | filler piece |
| 33 | coupling member |
| 34 | coupling member |
| 35 | filler piece |
| 36 | filler piece |

We claim:

1. A particle source, especially for reactive ion etching and plasma-enhanced CVD processes in pass-through apparatus for treating a large-area substrate, having a container completely enveloping a first plasma, a vacuum coating chamber having a chamber wall, surrounding the chamber walls of the container being enveloped by an at least bipolar magnetic field generator which produces a magnetic field which fulfills an electron-cyclotron resonance, a waveguide connected to the container through an opening for the feeding of electromagnetic waves for the production of the first plasma, and a coupling window permeable to the electromagnetic waves closing the opening between the waveguide and the container, characterized in that
   a) the container enveloping the first plasma is configured as a plasma chamber of a substantially parallelepipedal shape,
   b) the interior spaces of the plasma chamber and of the vacuum chamber are joined together by a common opening in the floor of the plasma chamber and in the chamber wall,
   c) in the plasma chamber directly in front of the coupling window there is an additional guard window which is thermally well uncoupled from the surrounding chamber walls of the plasma chamber and has a substantially constant gap between the guard window and the chamber walls, d) a separate gas feeding is performed of inert $O_2$ or $N_2$ gas into the space between the coupling window and the guard window, and of reactive gas into the space between the guard window and the substrate, and e) between the coupling window and the guard window an intermediate plasma is ignitable and thus the power distribution of the electromagnetic waves can be influenced.

2. A particle source according to claim 1, characterized in that the plasma chamber is quickly releasable by means of a flange connection and can be joined to the chamber wall of the vacuum chamber.

3. A particle source according to claim 1, characterized in that a shielding system is provided to confine the first plasma between the chamber wall and the substrate that is to be coated.

4. A particle source according to claim 1, characterized in that the distribution of the electromagnetic waves in the plasma chamber is variable by various T-shaped coupling members.

5. A particle source according to claim 1, characterized in that the electron density of the inert gas can be raised by a three-pole arrangement of the magnetic field generator in an area within the plasma chamber.

* * * * *